(12) United States Patent
Nakamura

(10) Patent No.: US 6,281,591 B1
(45) Date of Patent: Aug. 28, 2001

(54) SEMICONDUCTOR APPARATUS AND SEMICONDUCTOR APPARATUS MANUFACTURING METHOD

(75) Inventor: Akio Nakamura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/519,662

(22) Filed: Mar. 6, 2000

(30) Foreign Application Priority Data

Mar. 11, 1999 (JP) .................................................. 11-065157

(51) Int. Cl.[7] ..................................................... H01L 23/48
(52) U.S. Cl. ......................... 257/778; 257/737; 257/738; 257/784; 257/786
(58) Field of Search ................................. 252/782, 783, 252/787, 778

(56) References Cited

U.S. PATENT DOCUMENTS

| 5,379,187 | * | 1/1995 | Lee et al. ............................... 361/707 |
| 5,604,372 | * | 2/1997 | Yamaguchi ............................ 257/417 |
| 5,701,034 | * | 12/1997 | Marrs ..................................... 257/706 |
| 5,757,078 | * | 5/1998 | Matsuda et al. ....................... 257/737 |
| 5,786,631 | * | 7/1998 | Fishley et al. ......................... 257/701 |
| 5,801,435 | * | 9/1998 | Otsuki .................................... 257/675 |
| 5,883,440 | * | 3/1999 | Koyama et al. ....................... 257/787 |
| 5,886,415 | * | 3/1999 | Akagawa et al. ..................... 257/789 |
| 5,939,778 | * | 8/1999 | Boutin et al. ......................... 257/678 |
| 5,977,641 |   | 11/1999 | Takahashi et al. . |
| 5,989,982 |   | 11/1999 | Yoshikazu . |

FOREIGN PATENT DOCUMENTS

| 0 907 204 A3 | 8/1999 | (EP) . |
| 51-137378 | 11/1976 | (JP) . |
| 11-111896 | 4/1999 | (JP) . |
| 11224890 | 8/1999 | (JP) . |

* cited by examiner

Primary Examiner—Eddie Lee
Assistant Examiner—Lourdes Cruz
(74) Attorney, Agent, or Firm—Jones Volentine, PLLC

(57) ABSTRACT

The sealing resin of a semiconductor device is prevented from being peeled off from the substrate of the semiconductor device. A semiconductor device according to the present invention has a semiconductor substrate containing a central portion having a first thickness and a peripheral portion having a second thickness that is smaller than the first thickness, an electrode pad formed on the semiconductor substrate, a sealing resin for sealing the semiconductor substrate, a protruded electrode formed on the sealing resin, and a wire which electrically connects the electrode pad to the protruded electrode.

7 Claims, 6 Drawing Sheets

FIG. 1-A
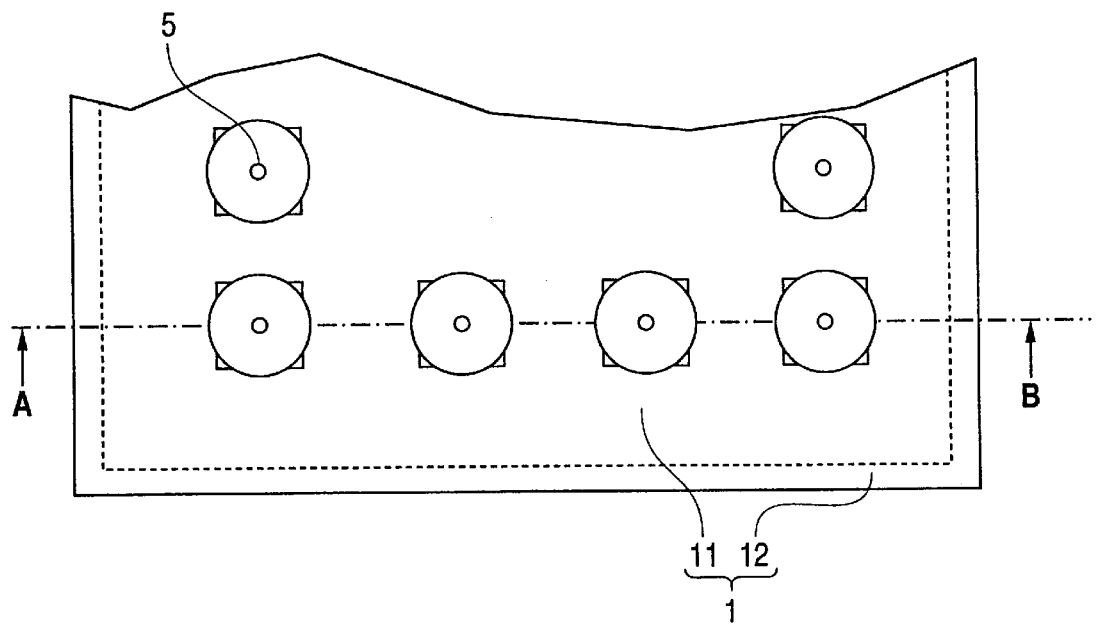
FIG. 1-B
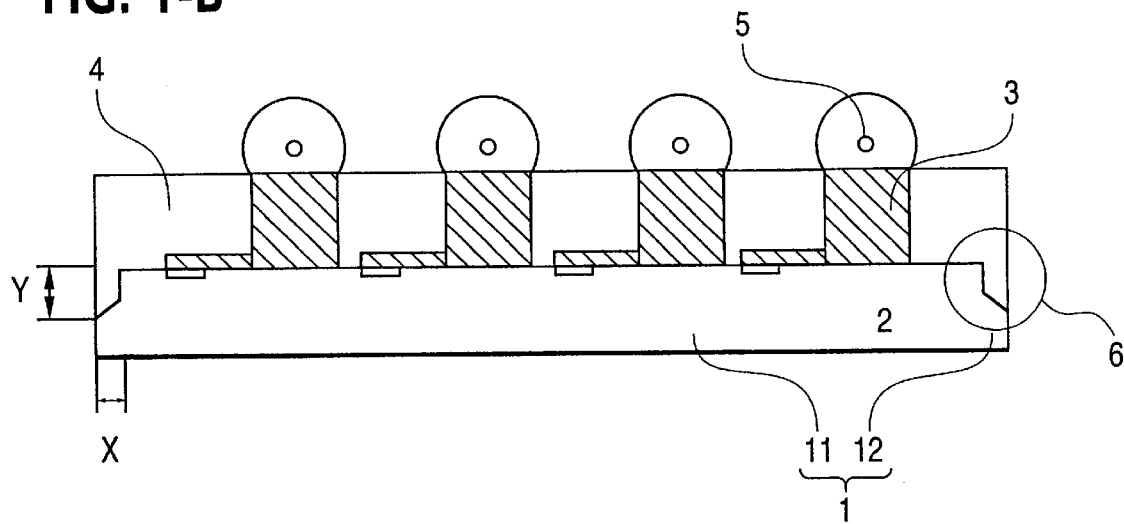

FIG. 2-A
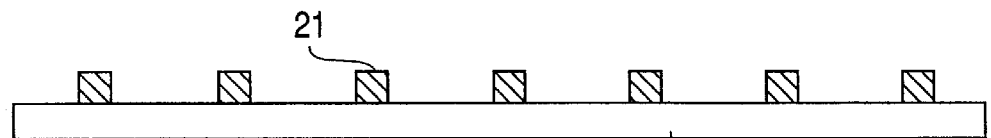
FIG. 2-B
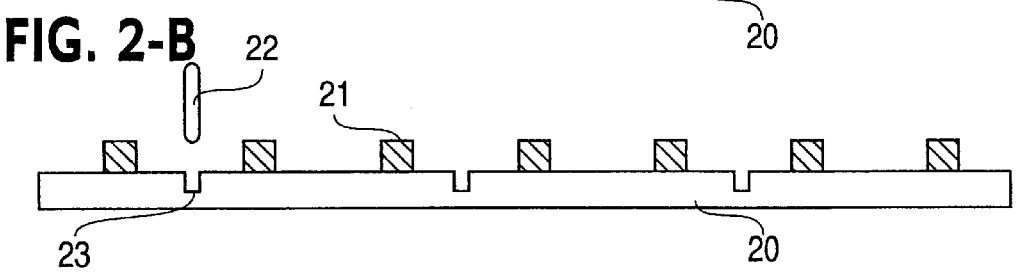
FIG. 2-C
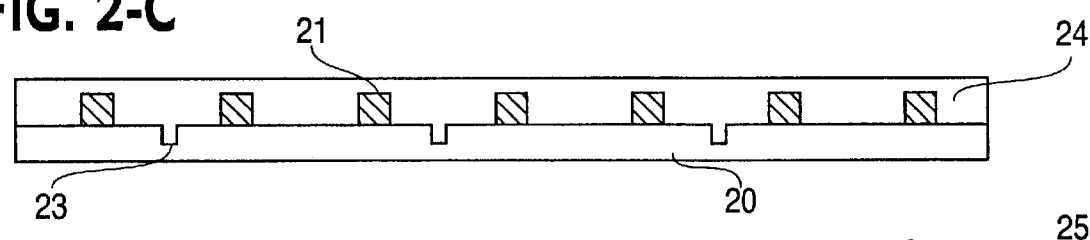
FIG. 2-D
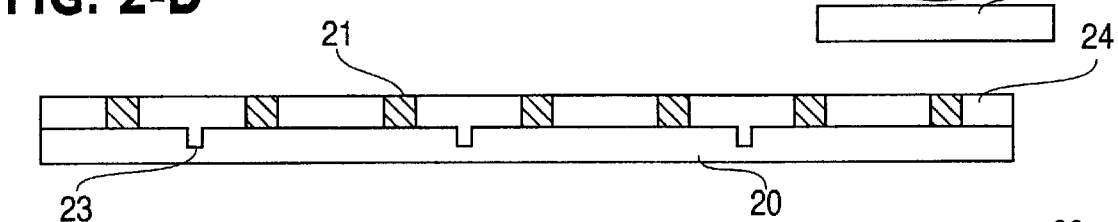
FIG. 2-E
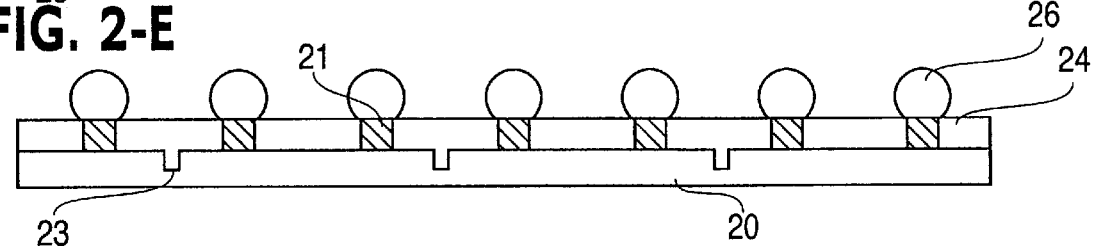
FIG. 2-F
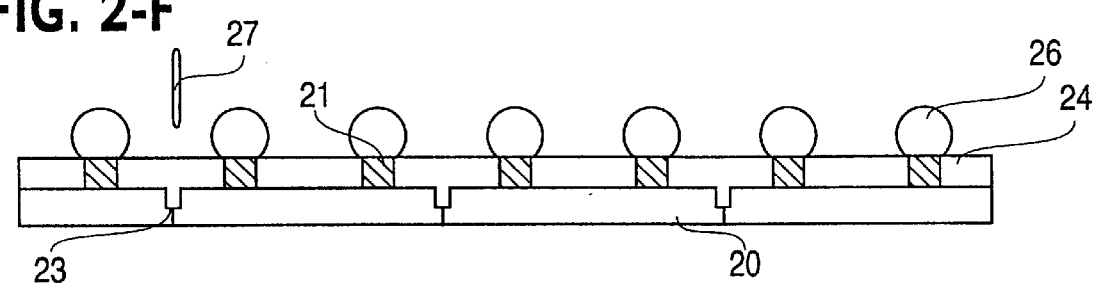

FIG. 3-A
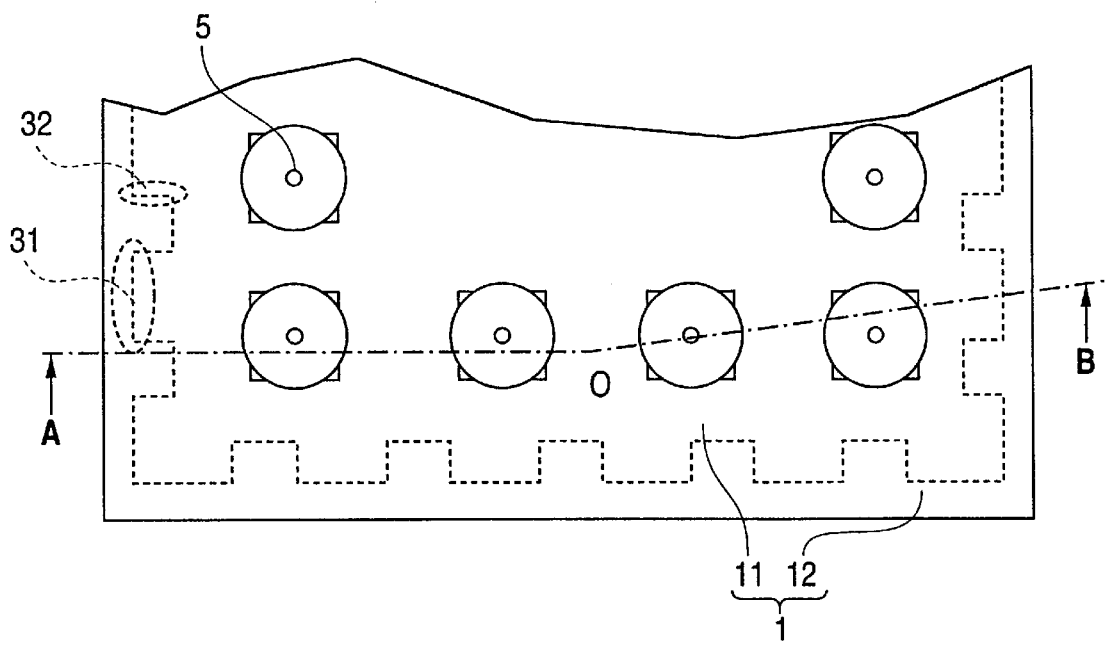
FIG. 3-B
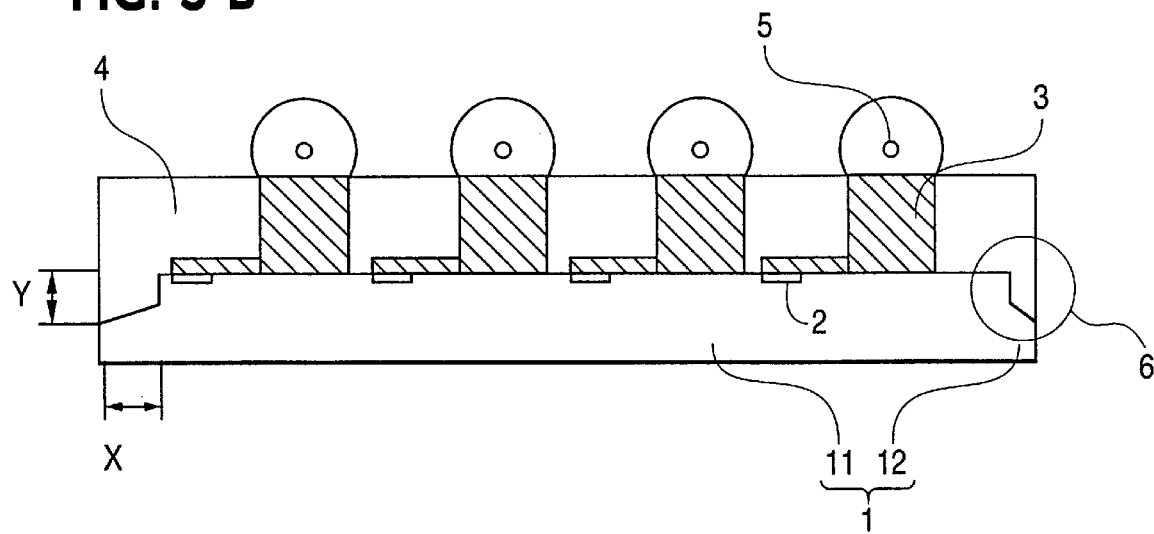

FIG. 4-A
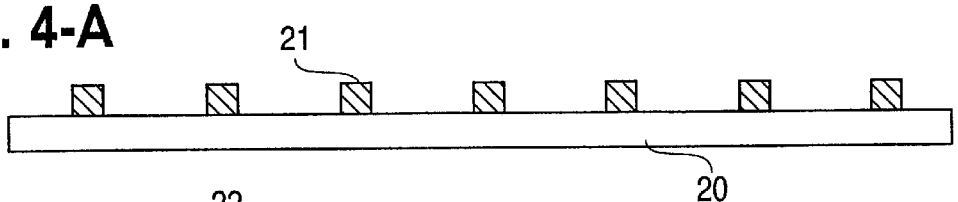
FIG. 4-B
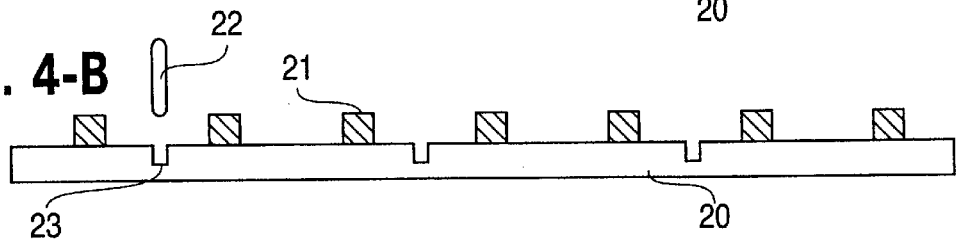
FIG. 4-C
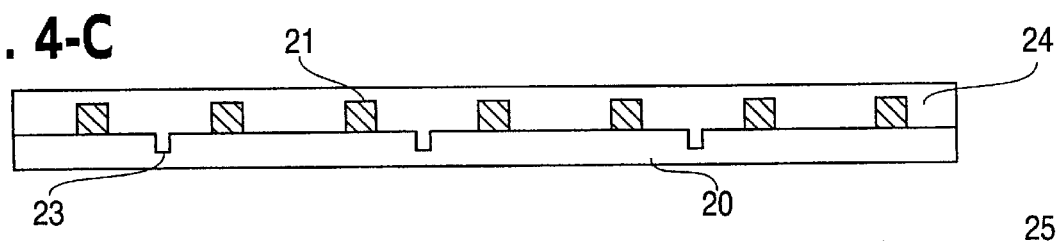
FIG. 4-D
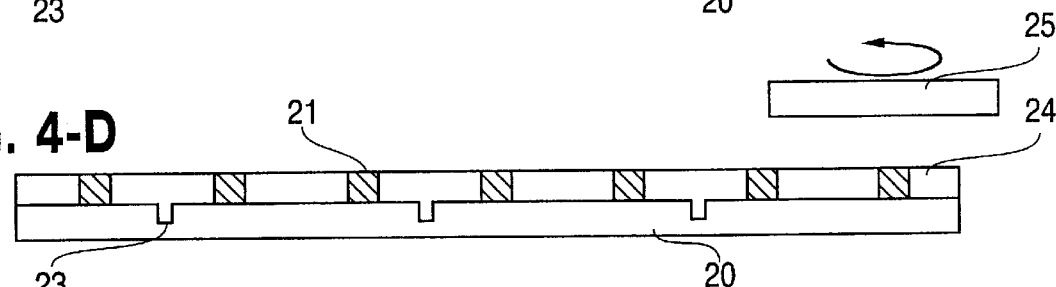
FIG. 4-E
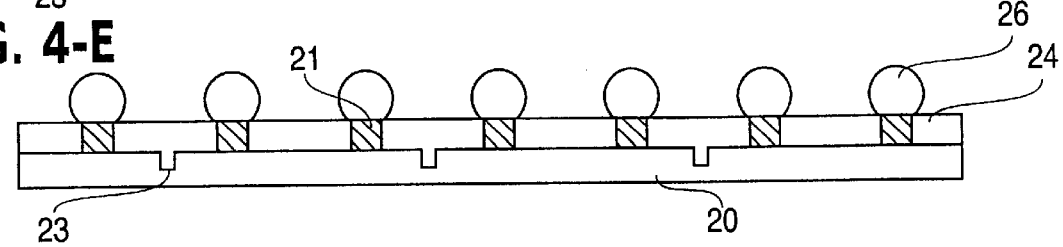
FIG. 4-F
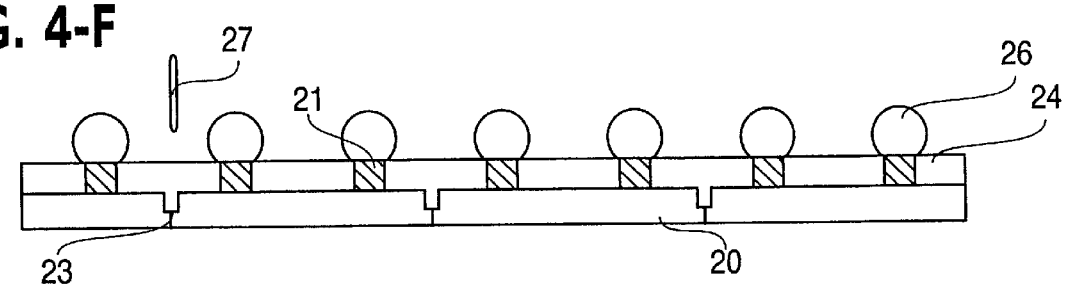

FIG. 7-A
(PRIOR ART)
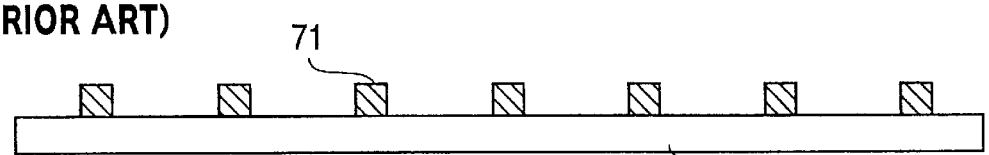
FIG. 7-B
(PRIOR ART)
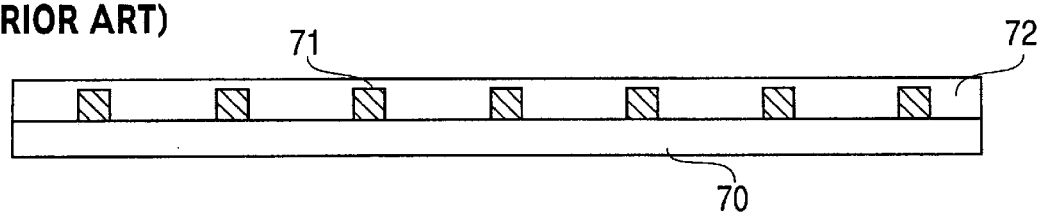
FIG. 7-C
(PRIOR ART)
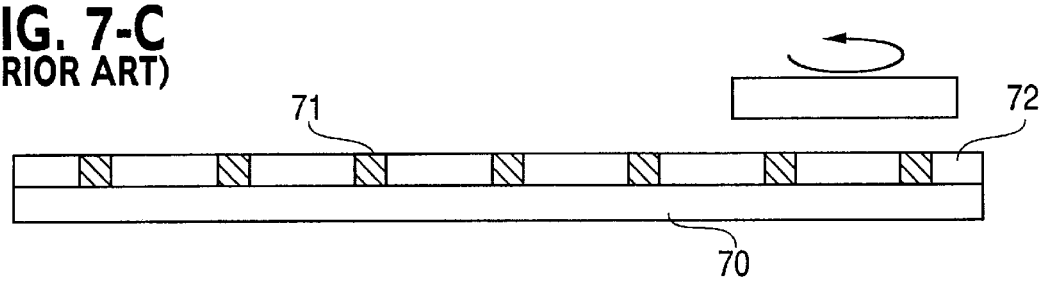
FIG. 7-D
(PRIOR ART)
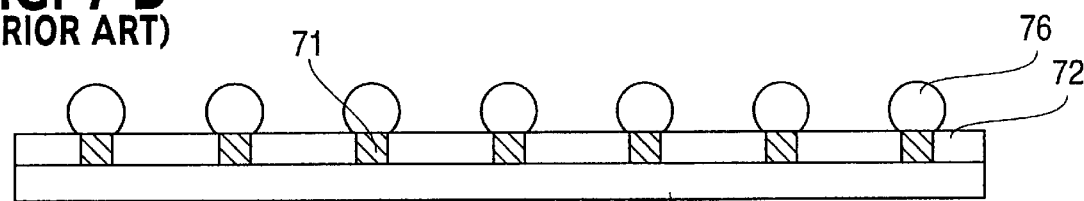
FIG. 7-E
(PRIOR ART)
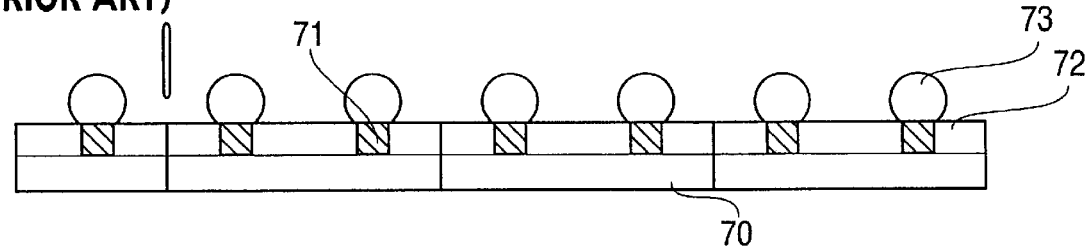

SEMICONDUCTOR APPARATUS AND SEMICONDUCTOR APPARATUS MANUFACTURING METHOD

BACKGROUND OF THE INVENTION

1. Field of the Invention

The present invention relates to a semiconductor apparatus and a semiconductor apparatus manufacturing method, in particular to a package of a semiconductor apparatus.

2. Description of Related Art

In recent years, semiconductor apparatuses are getting packaged with an increasingly higher density, and semiconductor devices such as chip size packages are receiving attention.

FIG. 6 shows a conventional chip size package. The semiconductor device shown in FIG. 6 is structured as follows. An electrode pad 2 is formed on a semiconductor substrate 1. A wire 3 made of Cu or the like to be electrically connected to the electrode pad 2 is also formed on the semiconductor substrate 1. The surface of the semiconductor substrate 1 and the wire 3 are sealed with a resin 4. A bump 5 made of solder is formed on the wire 3 that is exposed on the surface of the resin 4.

In what follows, a conventional semiconductor device manufacturing method will be explained with reference to FIGS. 7-A through 7-E. First, as shown in FIG. 7-A, a wire 71 made of Cu or the like is formed on a wafer 70 that is a semiconductor substrate. Second, as shown in FIG. 7-B, the entire wafer 70 is filled with a resin 72. Third, as shown in FIG. 7-C, the entire surface of the resin covering the wafer 70 is polished to expose the wire 71 on the surface. Fourth, as shown in FIG. 7-D, a bump electrode 73 made of solder or the like is formed on the surface of the wire 72. Fifth, as shown in FIG. 7-E, the wafer is cut into individual semiconductor devices. In this way, individual semiconductor devices are formed, which completes the semiconductor device manufacturing process.

However, the conventional semiconductor device manufacturing method has the following problems. First, when the wafer is divided into multiple individual semiconductor devices, a stress is created on the interface between the surface of each of the semiconductor devices and the resin. This stress often causes some of the semiconductor devices to be chipped. Second, the thermal stress generated when the semiconductor device is packaged causes the resin to be peeled off from the semiconductor device.

SUMMARY OF THE INVENTION

Given these problems, it is an object of the present invention to provide a semiconductor apparatus and a semiconductor apparatus manufacturing method capable of solving these problems.

A semiconductor device according to the present invention has a semiconductor substrate containing a central portion having a first thickness and a peripheral portion having a second thickness that is smaller than the first thickness, an electrode pad formed on the semiconductor substrate, a sealing resin for sealing the semiconductor substrate, a protruded electrode formed on the sealing resin, and a wire which electrically connects the electrode pad to the protruded electrode.

A semiconductor device manufacturing method according to the present invention has the following steps. First, an electrode pad is formed on a semiconductor wafer. Second, a wire to be connected to the electrode pad is formed. Third, a groove having a first width that varies between a first value as a lower limit and a second value as an upper limit is formed on a prescribed region of the semiconductor wafer. Fourth, in the semiconductor wafer and the wire are sealed with a resin. Fifth, a protruded electrode that is electrically connected to the wire is formed on the resin. Finally, the semiconductor wafer is divided into multiple semiconductor devices by cutting the prescribed region using a blade having a thickness that is smaller than the first width.

BRIEF DESCRIPTION OF THE DRAWINGS

FIGS. 1-A and 1-B shows the structure of a semiconductor device according to the first embodiment of the present invention.

FIGS. 2-A through 2-F are process diagrams showing the process of the semiconductor device manufacturing method according to the first embodiment of the present invention.

FIGS. 3-A and 3-B shows the structure of a semiconductor device according to the second embodiment of the present invention.

FIGS. 4-A through 4-F are process diagrams showing the process of the semiconductor device manufacturing method according to the second embodiment of the present invention.

FIGS. 7-A through 7-E are process diagrams showing a conventional semiconductor device manufacturing method.

DETAILED DESCRIPTION OF THE INVENTION (First Embodiment)

Figure 6:
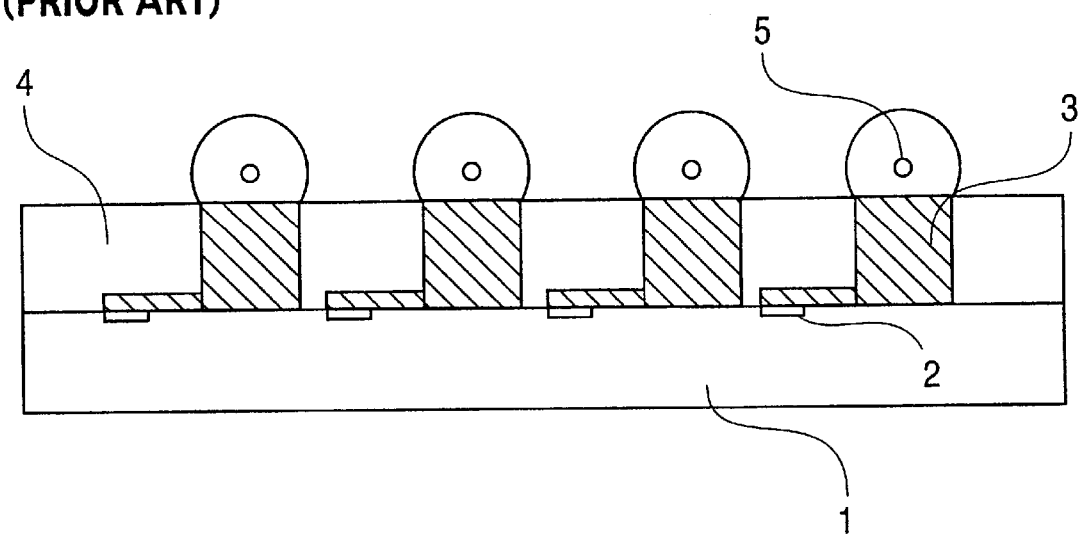
FIG. 6 shows the structure of a conventional semiconductor device.

FIGS. 1-A and 1-B shows the structure of a semiconductor device according to the first embodiment of the present invention. FIG. 1-A is a back-view of the semiconductor apparatus according to the first embodiment of the present invention. FIG. 1-B is a cross sectional view of what is shown in FIG. 1-A across the line AB. In what follows, the first embodiment of the present invention will be explained with reference to FIGS. 1-A and 1-B show. The same reference numerals are used for the components that are already used in FIG. 6.

The semiconductor substrate 1 has a prescribed thickness at the central portion 11. The thickness of the peripheral portion 12 of the semiconductor device in the semiconductor substrate 1 is smaller than the thickness of the central portion 11. The peripheral portion 12 of the semiconductor device thus forms a step unit 6 as shown inside the circle in FIG. 1-B. This step unit 6 is formed on the surface of the side on which the semiconductor substrate is sealed with the resin. It is desirable that the depth of this step unit 6, that is, the distance from the surface of the central portion 11 to the top portion of the peripheral portion 12 be larger than 10 μm (this distance is indicated by Y in FIG. 1-B). It is desirable that the distance from the edge portion of the semiconductor device to the central portion of the semiconductor device, that is, the width of the step unit 6 be larger than 3 μm (this distance is indicated by X in FIG. 1-B). Aluminum electrode pads 2 are formed at prescribed positions on the surface of the semiconductor substrate 1. A wire 3 made of Cu is formed on the semiconductor substrate 1. The wire 3 is electrically connected to the aluminum pad 2. The surface of the semiconductor substrate 1 and the wire 3 are sealed with a resin 4. Protruded electrodes 5 are formed over the resin 4. In the present embodiment, these protruded electrodes 5 are bump electrodes made of solder or the like that are formed over the wire 3 exposed on the surface of the resin 4.

In the semiconductor device of the present invention, the peripheral portion 12 of the semiconductor substrate 1 is thinner than the central portion 11, forming the step unit 6. This step unit 6 is formed on four sides surrounding the central portion 11 as shown in FIG. 1-A.

Due to the presence of this step unit 6, the area of contact increases in the peripheral portion 12 of the semiconductor device between the resin 4 and the semiconductor substrate 1. As a result, the strength of the anchor effect is increased.

Since the anchor effect has been increased, the resin 4 becomes harder to be peeled off from the semiconductor substrate 1.

The semiconductor device of the present invention is stable since the resin is harder to be peeled off from the semiconductor substrate by the thermal stress that is generated when the semiconductor device is packaged.

FIGS. 2-A through 2-F are process diagrams showing the process of the semiconductor device manufacturing method according to the first embodiment of the present invention.

Next, the manufacturing method of the semiconductor device according to the first embodiment of the present invention will be explained with reference to FIGS. 2-A through 2-F.

First, as shown in FIG. 2-A, a wire 21 made of Cu is formed on a semiconductor wafer 20 by an electric plating process or the like. This wire is electrically connected to an electrode pad formed on a wafer not shown in the drawing.

After this, a groove 23 is formed on the surface of the semiconductor wafer 20 using a peripheral blade 22 that rotates at high speed. This groove is formed in the portion that is to be the peripheral portion of each individual semiconductor device. The thickness of the peripheral blade 22 used to form the groove is between 35 $\mu$m and 150 $\mu$m. The width of the groove 23 is made larger than the thickness of the peripheral blade 22 by 1 $\mu$m to 5 $\mu$m. The depth of the groove 23 is set larger than 10 $\mu$m as shown in FIG. 2-B. By making the groove 23 deeper than 10 $\mu$m, the groove can be formed with a stable width without depending very much on the shape of the tip of the blade 22.

After this, the surface of the semiconductor wafer 20 is filled with the resin 24. As a result, the groove 23 is also filled with the resin 24 as shown in FIG. 2-C.

Next, as shown in FIG. 2-D, the surface of the resin 24 is polished with the polishing blade 25 until the wire 21 embedded in the resin 24 is exposed. After this, as shown in FIG. 2-E, a bump electrode 26 made of a solder ball is formed on the wire 21.

After this, the portion in which the groove 23 has been formed in the previous process is cut with a high speed rotating peripheral blade 27. As a result, the semiconductor wafer 20 is divided into multiple semiconductor devices. In this case, it is desirable that the thickness of the peripheral blade 27 be smaller than that of the blade 22, preferably by more than 6 $\mu$m as shown in FIG. 2-F.

According to the manufacturing method of the present invention, the semiconductor wafer 20 is divided into multiple semiconductor devices by forming the groove 23 on the surface of the semiconductor wafer 20, sealing with a resin the surface of the semiconductor wafer 20, and cutting the semiconductor wafer 20 along the groove 23.

When the blade directly hits the surface of the semiconductor wafer 20, a stress is applied to the surface of the semiconductor wafer 20. The blade 27 used to divide the semiconductor wafer 20 into multiple semiconductor devices dose not directly hit the surface of the semiconductor wafer 20. Instead, the blade 27 hits the bottom of the groove 23. Hence, the stress is applied to the surface of the semiconductor wafer 20 when the groove 23 is formed but not when the semiconductor wafer 20 is cut into multiple semiconductor devices.

When the groove 23 is formed, the semiconductor wafer 20 is cut to a small depth. Therefore, in this case, the length of time the blade 22 stays in contact with the surface of the semiconductor wafer 20 is shorter compared with the case in which the semiconductor wafer 20 is cut into multiple semiconductor devices. Therefore, the stress applied to the surface of the semiconductor wafer 20 in this case is small. As a result, the surface of each of the multiple semiconductor devices is less likely to be broken or cracked. Even if the surface of the semiconductor wafer 20 is chipped when the groove 23 is formed, the chipped portion is filed with the resin 24. Therefore, the chipped portion does not get corroded.

Thus, according to the semiconductor device and semiconductor device manufacturing method of the first embodiment of the present invention, semiconductor devices are provided without having the resin portion peeled off from the semiconductor substrate while reducing the amount the surface of the semiconductor device is chipped.

(Second Embodiment)

FIGS. 2-A through 2-F the structure of a semiconductor device according to the second embodiment of the present invention.

FIG. 3-A is a back view of the semiconductor device according to the second embodiment of the present invention. FIG. 3-B is a cross sectional view of what is shown in FIG. 3-A across the line A-O-B. In what follows, the second embodiment of the present invention will be explained with reference to FIGS. 3-A and 3-B. The same reference numerals are used for the components that are already used in FIGS. 1-A and 1-B.

The second embodiment is identical with the first embodiment in that a step unit 6 is formed on the semiconductor substrate 1.

As shown in FIG. 3-A with the broken line, the width of the step unit 6 is varied periodically like a pule wave form (this width is shown by X in the drawing). By forming the step unit 6 in this shape, the degree of the anchor effect of the step unit 6 is further increased. Moreover, as shown in FIG. 3-A, the step is formed in two directions along each side of the semiconductor device. The step consists of step portions 31 that are parallel to the side of the semiconductor device and step portions 32 that are perpendicular to the side of the semiconductor device.

Therefore, regardless of the direction from which a shear stress or thermal stress is applied to the semiconductor device, it is possible to prevent the resin from getting peeled off from the semiconductor substrate.

Hence, according to the second embodiment, the resultant semiconductor device has an anchor effect that is superior to the anchor effect achieved in the first embodiment.

Figure 5:
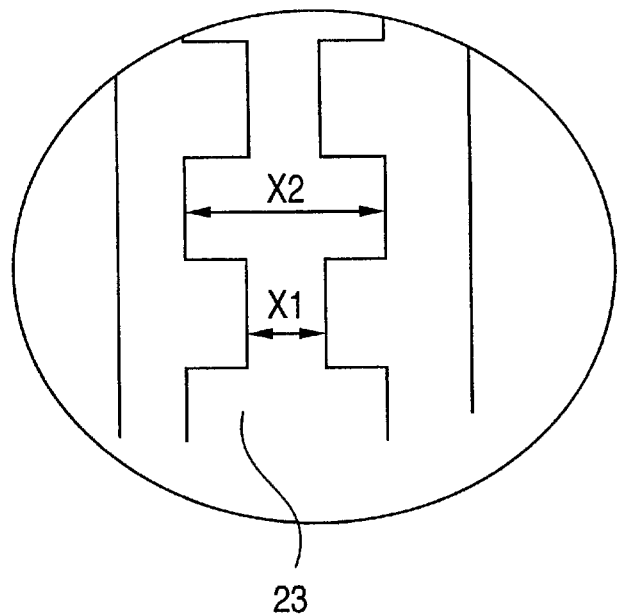
FIG. 5 shows the shape of the groove formed in the process of the semiconductor device manufacturing method according to the second embodiment of the present invention.

FIGS. 4-A through 4-F are process diagrams showing the process of the semiconductor device manufacturing method according to the second embodiment of the present invention. FIG. 5 shows the shape of the groove formed in the process of the semiconductor device manufacturing method according to the second embodiment of the present invention.

Next, the semiconductor device manufacturing method of the second embodiment of the present invention will be explained with reference to FIGS. 4-A through 4-F. The same reference numerals are used for the components that are already used in FIGS. 2-A through 2-F.

First, a wire 21 made of Cu is formed on a semiconductor wafer 20 by an electric plating process as shown in FIG. 4-A.

Second, a groove 23 is formed on the surface of the semiconductor wafer 20 by illuminating a laser light onto the surface of the semiconductor wafer 20. This groove 23 is formed in each of those portions that are to become the peripheral portions of the multiple semiconductor devices to be formed. The width of the groove 23 is varied periodically between the lower limit of X1 $\mu$m and the upper limit X2 $\mu$m. The depth of the groove 23 is set to 10 $\mu$m as shown in FIG. 4-B. FIG. 5 is a magnified top view of the shape of the groove 23.

Third, as shown in FIG. 4-C, the surface of the semiconductor wafer 20 is filled with a resin 24. In this case, the groove 23 is also filled with the resin 24.

Fourth, as shown in FIG. 4-D, the surface of the resin 24 is polished using a polishing blade 25 until the wire 21 embedded in the resin 24 is exposed.

Fifth, as shown in FIG. 4-E, a bump electrode 26 made of a solder ball or the like is formed on the exposed wire 20.

Finally, as shown in FIG. 4-F, the semiconductor wafer 20 is cut and divided into multiple semiconductor devices using a high speed rotating peripheral blade 27. In this case, it is desirable that the thickness of the peripheral blade 27 be made smaller than the minimum width X1 of the groove. If possible, the thickness of the peripheral blade 27 should be made smaller than the minimum width X1 of the groove by at least 6 $\mu$m.

As in the first embodiment, the amount of stress applied to the surface of the semiconductor wafer can be reduced. In the present embodiment, the step unit is formed in the shape of a pulse wave form. As a result, the stress that is generated when the resin 24 hardens and contracts is absorbed by the step unit. Thus, according to the semiconductor device manufacturing method of the second embodiment, stable semiconductor devices are provided without having the resin portion peeled off from the semiconductor substrate.

In the embodiments of the present invention, the wire was exposed by polishing the sealing resin. However, it is not necessary to polish the sealing resin if the amount of the resin is controlled so that the wire will be exposed in sealing the semiconductor surface with the resin.

It should be noted that the shape of the step unit need not be like a pulse wave form. The same effect can be achieved by varying the width of the step unit within a range between a prescribed upper limit and a prescribed lower limit and by dividing the semiconductor substrate into individual devices using a blade whose thickness is smaller than the lower limit width of the step unit.

What is claimed is:

1. A semiconductor device, comprising:
   a semiconductor substrate having a central portion and a peripheral portion surrounding said central portion, wherein a thickness of said semiconductor substrate in said peripheral portion gradually decreases with increasing distance from said central portion;
   an electrode pad which is located on said central portion of said semiconductor substrate;
   a wire having a first portion and a second portion, wherein said first portion is located on said electrode pad, and said second portion is located on said central portion of said semiconductor substrate;
   an electrode bump which is mounted on an upper surface of said second portion of said wire; and
   a sealing resin which seals a surface of said semiconductor substrate, said electrode pad, said first portion of said wire and a side surface of said second portion of said wire.

2. A semiconductor device as claimed in claim 1, wherein the thickness of the peripheral portion is less than a thickness of said central portion by more than 10 $\mu$m.

3. A semiconductor device, comprising:
   a semiconductor substrate having a central portion and a peripheral portion surrounding said central portion, wherein a thickness of said semiconductor substrate in said peripheral portion gradually decreases toward an edge of said semiconductor substrate, and wherein an edge of said central portion is uneven against the edge of said semiconductor substrate;
   an electrode pad located on said central portion of said semiconductor substrate;
   a wire electrically connected to said electrode pad;
   an electrode bump which is mounted on an upper surface of said wire; and
   a sealing resin which seals a surface of said semiconductor substrate and at least a portion of said wire.

4. A semiconductor device as claimed in claim 3, wherein said peripheral portion of said semiconductor substrate has a width that is equal to a distance from an edge portion of said semiconductor device to said central portion, and wherein the width of said peripheral portion varies between a first value and a second value.

5. A semiconductor device as claimed in claim 3, wherein said peripheral portion of said semiconductor substrate has a width that is equal to a distance from the edge of said semiconductor device to said central portion, and said width of said peripheral portion is over 3 $\mu$m.

6. A semiconductor device as claimed in claim 3, wherein the thickness of said peripheral portion is less than a thickness of said central portion by more than 10 $\mu$m.

7. A semiconductor device, comprising:
   a substrate having a first area and a second area surrounding said first area, wherein a thickness of said substrate in said second area gradually decreases toward an edge of said substrate;
   a plurality of pads which are located on said first area of said substrate;
   a plurality of first conductive layers respectively located on said plurality of pads;
   a plurality of second conductive layers which have a thickness that is greater than a thickness of said first conductive layers, wherein each of said second conductive layers is located on said first area of said substrate, and wherein said second conductive layers are electrically connected with said first conductive layers;
   a plurality of electrode bumps, wherein each of said electrode bumps is mounted on an upper surface of said second conductive layers; and
   a sealing resin which seals a surface of said substrate, said first conductive layers and a portion of said second conductive layers.

* * * * *